(12) United States Patent
McLellan et al.

(10) Patent No.: US 7,232,755 B1
(45) Date of Patent: Jun. 19, 2007

(54) PROCESS FOR FABRICATING PAD FRAME AND INTEGRATED CIRCUIT PACKAGE

(75) Inventors: Neil McLellan, Markham (CA); Chun Ho Fan, Tsuen Wan (HK); Kwok Cheung Tsang, Kowloon (HK); Kin Pui Kwan, Kowloon (HK)

(73) Assignee: ASAT Ltd., Tsuen Wan, New Territories (HK)

( * ) Notice: Subject to any disclaimer, the term of this patent is extended or adjusted under 35 U.S.C. 154(b) by 0 days.

(21) Appl. No.: 11/194,993

(22) Filed: Aug. 2, 2005

(51) Int. Cl.
*H01L 21/44* (2006.01)
(52) U.S. Cl. ...................... 438/674; 438/613; 438/614; 438/615; 257/E23.037
(58) Field of Classification Search ................ 438/674, 438/613, 614, 615; 257/E23.037
See application file for complete search history.

(56) References Cited

U.S. PATENT DOCUMENTS 6,498,099 B1   12/2002   McLellan et al.
6,622,907 B2 *  9/2003   Fanti et al. ................. 228/215
6,706,622 B1 *  3/2004   McCormick ................ 438/614
6,933,594 B2 *  8/2005   McLellan et al. ........... 257/676
7,012,019 B2 *  3/2006   Hsu et al. ................... 438/618
2002/0149118 A1* 10/2002   Yamaguchi et al. ......... 257/778
2004/0209452 A1* 10/2004   Kim ............................ 438/613
2006/0027936 A1*  2/2006   Mizukoshi et al. ......... 257/781

* cited by examiner

*Primary Examiner*—George R. Fourson
*Assistant Examiner*—John M. Parker
(74) *Attorney, Agent, or Firm*—Morrison & Foerster LLP

(57) ABSTRACT

A process for fabricating a pad frame for an integrated circuit package includes building up metal on selective portions of a first side of a substrate to define a plurality of contact pads disposed in a first layer of dielectric material, depositing a metal seed layer on an exposed side of the contact pads and the dielectric material, applying a second metal layer on the metal seed layer, selectively etching the second metal layer and the metal seed layer to provide pad frame circuitry, and building up metal on selective portions of the pad frame circuitry to define a plurality of die connect pads separated by a second layer of dielectric material, the die connect pads being electrically connected to the contact pads by the pad frame circuitry.

21 Claims, 3 Drawing Sheets

PROCESS FOR FABRICATING PAD FRAME AND INTEGRATED CIRCUIT PACKAGE

FIELD OF THE INVENTION

The present invention relates generally to integrated circuit packaging and more particularly to a process for fabricating a pad frame and a thin array plastic package.

BACKGROUND OF THE INVENTION

An etch back process for fabricating a frame for an integrated circuit package is disclosed in U.S. Pat. No. 6,498,099, assigned to the assignee of the present application, the entire contents of which are incorporated herein by reference. According to this process, a copper substrate strip is first subjected to a partial etch on one or both of the top and bottom surfaces to create a pattern of contact leads (pads) and a die attach pad (paddle). After wire bonding the contacts to a singulated semiconductor die, followed by overmolding and curing of the mold, the leadframe strip is exposed to a second immersion etch for exposing the contact pads in an array pattern (i.e. multi-row) or perimeter pattern (i.e. single row), as well as the die attach pad. In the case of a package with multi-row I/O leads, this etch back step eliminates the previously required two additional saw singulation operations (i.e. to sever the inner leads from the outer leads), and in both the single-row and multi-row configurations, the etch back step eliminates the previously required post mold processing steps (e.g. mold deflashing) and ensures superior device yield over prior processing techniques. Additionally, this technique allows for higher I/O pad density and pad standoff from the package bottom compared to prior art techniques, thereby reducing stress in the solder joint during PCB temp cycling. Further, the technique allows for the use of a pre-singulation strip testing technique since the electrical I/O pads are isolated from each other. This feature greatly increases the handling and throughput of the test operation as compared to prior processes.

According to co-pending U.S. patent application Ser. No. 09/802,678 for a Leadless Plastic Chip Carrier With Etch Back Pad Singulation, assigned to the assignee of the present application, the entire contents of which are incorporated herein by reference, a build up fabrication process is provided. The build up process is carried out on a copper substrate strip. Metal layers are selectively plated up on the copper substrate strip to provide built-up die attach pads, each circumscribed by at least one row of contact pads (I/O pads) on the copper strip. After the build up process, semiconductor dice are fixed to respective die attach pads and gold wires are bonded between pads of the semiconductor dice and respective contact pads. The packages are then molded by placing the substrate strip in a mold. Following molding of the packages, the copper substrate strip is etched away to expose the die attach pad and the contact pads of each package.

Flip chip packages have become possible with advances in package fabrication including forming and placing of solder balls. Such packages are desirable due to increased electrical and mechanical performance. Direct connection of the semiconductor die to a pad frame surface in a flip-chip orientation, using solder ball connections provides low impedance packages relative to the use of wire-bond connections and provides reduced package space. Popularity of flip chip, thin array plastic packages has been limited by fabrication and cost of manufacture of pad frames, however.

Further developments in packaging technology are therefore driven by demand for improved reliability, electrical performance, decreased size and cost of manufacture.

SUMMARY OF THE INVENTION

According to one aspect of the present invention, there is provided a process for fabricating a pad frame for an integrated circuit package. The process includes building up metal on selective portions of a first side of a substrate to define a plurality of contact pads disposed in a first layer of dielectric material, depositing a metal seed layer on an exposed side of the contact pads and the dielectric material, applying a second metal layer on the metal seed layer, selectively etching the second metal layer and the metal seed layer to provide pad frame circuitry, and building up metal on selective portions of the pad frame circuitry to define a plurality of die connect pads separated by a second layer of dielectric material, the die connect pads being electrically connected to the contact pads by the pad frame circuitry.

In another aspect of the present invention, there is provided a process for fabricating an integrated circuit package. The process includes building up metal on selective portions of a first side of a substrate to define a plurality of contact pads disposed in a first layer of dielectric material, depositing a metal seed layer on an exposed side of said contact pads and said dielectric material, applying a second metal layer on said metal seed layer, selectively etching said second metal layer and said metal seed layer to provide pad frame circuitry, building up metal on selective portions of said pad frame circuitry to define a plurality of die connect pads separated by a second layer of dielectric material, said die connect pads being electrically connected to said contact pads by said pad frame circuitry, flip-chip mounting a semiconductor die to said die connect pads such that pads of said semiconductor die are electrically connected to said die connect pads by a plurality of solder ball connectors, providing an underfill material surrounding said solder ball connectors, etching away said substrate to expose said contact pads, and singulating said integrated circuit package.

Advantageously, a flip chip package provides low impedance packages relative to the use of wire-bond connections and provides reduced package space. The pad frame according to an aspect of the present invention is fabricated to provide routability using a low cost fabrication technique compared with the prior art. Die to package size ratio is also improved to near that of a chip scale package.

BRIEF DESCRIPTION OF THE DRAWINGS

The present invention will be better understood with reference to the drawings and the following description, in which.

DETAILED DESCRIPTION OF THE PREFERRED EMBODIMENTS

Figure 1A:
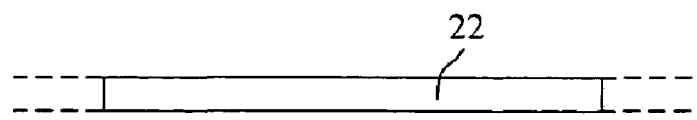
FIGS. 1A to 1L show processing steps for fabricating a pad frame for an integrated circuit package, according to an embodiment of the present invention.

Reference is made to FIGS. 1A to 1L to describe a process for fabricating a pad frame indicated generally by the numeral 20, for an integrated circuit package. The process includes building up metal on selective portions of a first side of a substrate 22 to define a plurality of contact pads 24 disposed in a first layer of dielectric material. A metal seed layer 28 is deposited on an exposed side of the contact pads 24 and the dielectric material 26. A second metal layer is applied on the metal seed layer 28 and the second metal layer and the metal seed layer 28 are selectively etched to provide pad frame circuitry 30. Metal is then built up on selective portions of the pad frame circuitry 30 to define a plurality of die connect pads 32 separated by a second layer of dielectric material. The die connect pads 32 are electrically connected to the contact pads 24 by the pad frame circuitry 30.

The process for manufacturing the integrated circuit package 20 will now be described in more detail, with continued reference to FIGS. 1A to 1J. FIG. 1A shows a sectional side view of a Cu (copper) panel that provides a substrate for fabricating the pad frame 20. The copper panel substrate is in the form of a strip for fabricating a pad frame 20 in an array format (e.g. 3×3 or 5×5 array, etc.) for fabricating several integrated circuit packages. Only one portion of the copper panel substrate is shown to illustrate the fabrication of one portion of a pad frame 20, adjacent portions of the copper panel substrate being indicated by stippled lines. It will be appreciated that adjacent portions of the copper panel substrate are similar to the portion depicted. Similarly, adjacent portions of the pad frame 20 are similar to that depicted at each step of the fabrication process shown in the Figures: For simplicity, the fabrication steps described herein refer to only one such portion of a pad frame 20.

Figure 1B:
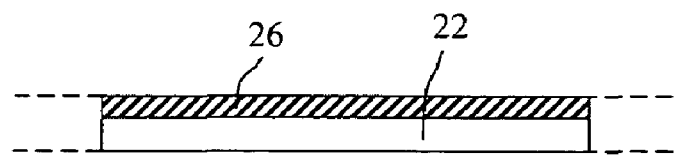
Figure 1C:
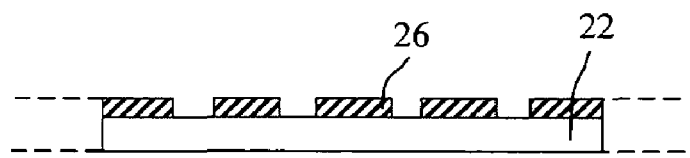

Referring now to FIG. 1B, a photo-imageable solder-resist plating mask 26 is deposited on a first side of the copper substrate 22. In the present embodiment, the photo-imageable plating mask 26 is a dielectric photo-imageable polymer such as benzocyclobutene (BCB). The photo-imageable plating mask 26 is applied to the copper substrate 22, soft-baked, selectively exposed using a photo-tool, developed to provide pits in the photo-imageable plating mask 26 in which portions of the first side of the substrate 22 are exposed, and hard baked. The resulting substrate including the dielectric layer of developed and hard baked photo-imageable plating mask 26 is shown in FIG. 1C.

Figure 1D:
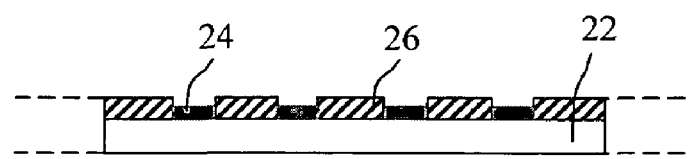

The exposed portions on the first side of the substrate 22 are then plated up with layers of suitable metals to provide a plurality of contact pads 24 that include layers of plated metals (FIG. 1D). One option for plating includes electrolytic, flash plating an etch barrier layer of gold (Au) (for example, 0.003 μm), followed by electrolytic plating of palladium (Pd) (for example, 0.002 μm) and electrolytic plating of a layer of nickel (Ni) (for example, 0.5 μm).

Figure 1E:
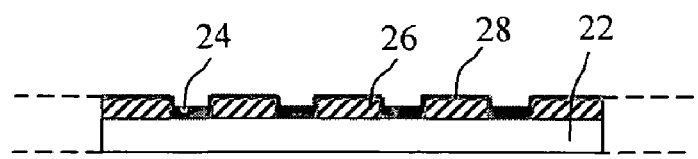

After electrolytic plating up to form the contact pads 24, a metal seed layer 28 is applied to the exposed surface of the contact pads 24 and the dielectric polymer layer (FIG. 1E). Suitable metals for the metal seed layer 28 include any one of, for example, Cu, Ni or chromium (Cr). The metal seed layer 28 is applied using suitable means such as electroless plating or sputter coating of about 1 micron of metal to cover both the contact pads 24 and the dielectric polymer layer.

Figure 1F:
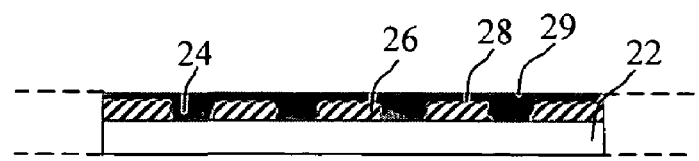

The metal seed layer 28 is then electrolytically plated up with a layer of suitable metal such as Cu of a thickness of, for example, 50 microns to build up the metal seed layer 28 with a second metal layer 29 (FIG. 1F).

Figure 1G:
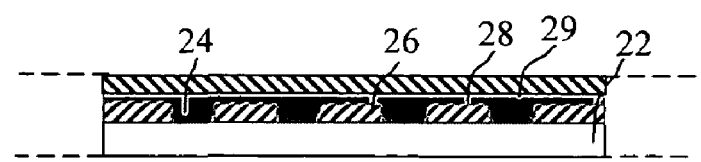
Figure 1H:
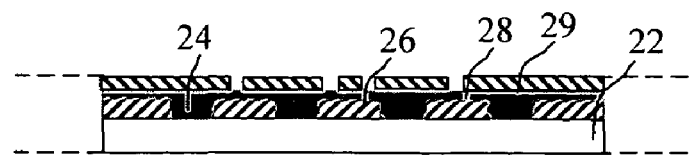

Referring now to FIG. 1G, photo-imageable etch-resistant mask is deposited on the exposed side of the second metal layer 29 electrolytically plated on top of the metal seed layer 28. The photo-imageable etch-resistant mask is spin-coated or laminated on the second metal layer 29 resulting in the photo-imageable etch-resistant mask shown in FIG. 1G, selectively exposed using a photo-tool and developed to provide pits in the etch-resistant mask in which portions of the second metal layer 29 are exposed as shown in FIG. 1H.

Figure 1I:
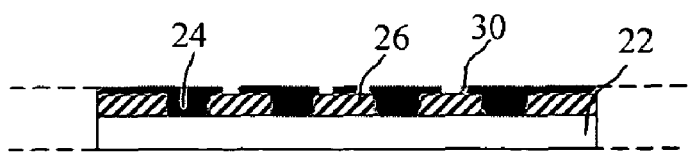

The second metal layer 29 and the metal seed layer 28 are then etched, for example, by pressurized spray etching, first etching through the exposed portions of the second metal layer 29 and then through the metal seed layer 28. The photo-imageable etch-resistant mask is then stripped away using conventional means, leaving the remainder of the selectively etched second metal layer 29 and metal seed layer 28 to provide pad frame circuitry 30 as shown in FIG. 1I.

Figure 1J:
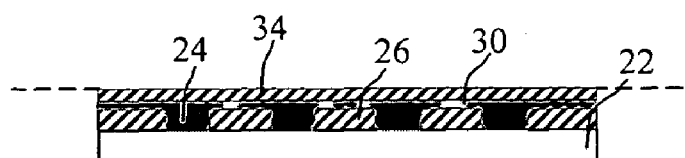
Figure 1K:
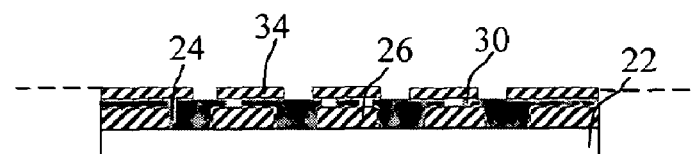

Referring now to FIG. 1J, a second layer of photo-imageable solder-resist plating mask 34 is deposited on the pad frame circuitry 30 and on the exposed portions of photo-imageable solder-resist plating mask 26 deposited on the substrate 22 as described above. In the present embodiment, the photo-imageable plating mask 34 is a dielectric photo-imageable polymer such as benzocyclobutene (BCB). The photo-imageable polymer is applied to the pad frame circuitry 30 and exposed portions of the previously deposited photo-imageable solder-resist plating mask 26, soft-baked, selectively exposed using a photo-tool, developed to provide pits in the second layer of photo-imageable plating mask 34 in which portions of the pad frame circuitry 30 are exposed, and hard baked. The resulting substrate including the second dielectric layer of developed and hard baked photo-imageable plating mask 34 is shown in FIG. 1K.

Figure 1L:
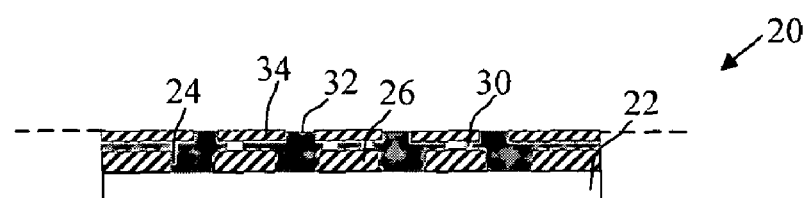

Layers of suitable metals are then built up on the exposed portions of the pad frame circuitry 30 to provide a plurality of die connect pads 32 (FIG. 1L). One option for building up metals to form the die connect pads 32 includes electrolytic plating of, for example, Ni, followed by Au. In another option for building up metals to form the die connect pads 32, metal is solder paste printed on the exposed portions of the pad frame circuitry 30, followed by reflowing and coining. In the 1st option, the final layer of Au provides a suitable surface for flip-chip mounting a solder bumped semiconductor die using solder to connect the die connect pads 32 to pads of the semiconductor die.

A process for fabricating a pad frame 20 for an integrated circuit package is described hereinabove. As indicated, the pad frame 20 is fabricated in an array for fabricating several integrated circuit packages.

Figure 1M:
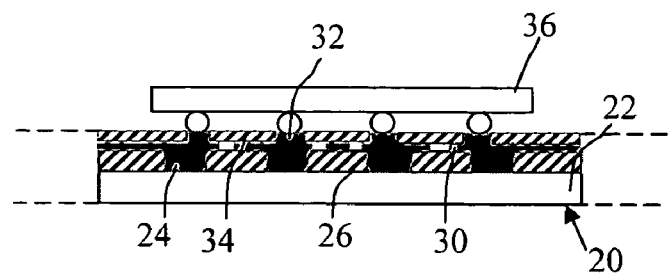
FIGS. 1M to 1Q show further processing steps for fabricating a leadless plastic chip carrier according to another embodiment of the present invention.

To then fabricate an integrated circuit package, a solder bumped semiconductor die 36 is flip-chip mounted to the pad frame 20 as shown in FIG. 1M. The solder bumped semiconductor die 36 is mounted to the pad frame 20 by solder-connection of pads of the semiconductor die 36 with the die connect pads 32 of the pad frame 20. It will be appreciated that the solder bumps of the semiconductor die 36 align with the die connect pads 32 of the pad frame 20 and the solder electrically connects the semiconductor die 36 with the die connect pads 32.

Figure 1N:
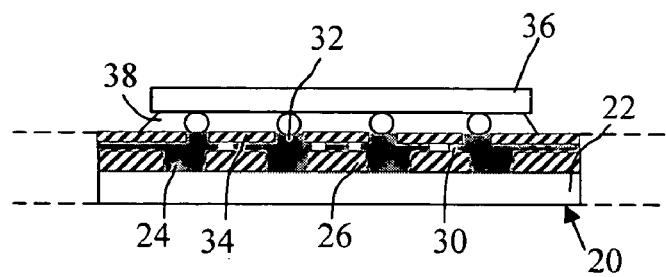

The area under the semiconductor die 36 is filled with a thermosetting plastic compound, referred to generally as an underfill material 38. As shown in FIG. 1N, the underfill material 38 surrounds the solder bumps that connect the semiconductor die 36 and the die connect pads 32. The underfill material 38 serves to absorb some of the thermally induced stresses and protect the bump to pad connection from the environment.

Figure 1O:
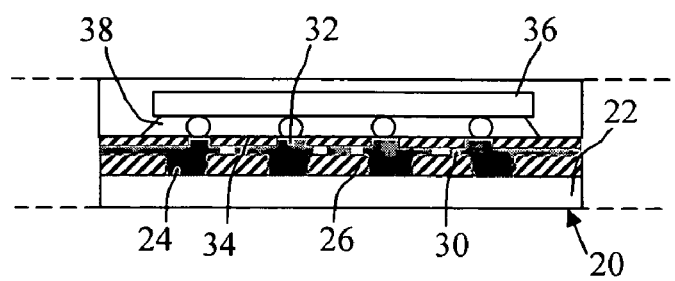

The pad frame 20 is then molded using a molding material in a modified mold with the bottom cavity being a flat plate, and subsequently cured (FIG. 1O).

Figure 1P:
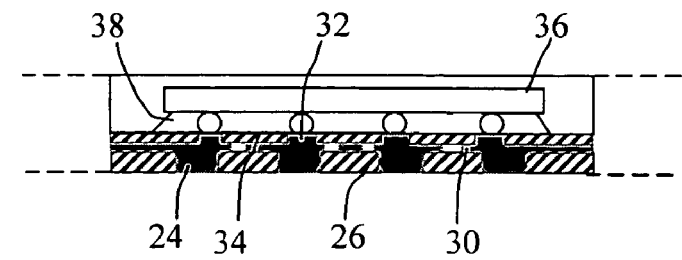

Referring now to FIG. 1P, the copper panel substrate 22 is etched away, to expose a surface of each of the contact pads 24.

Figure 1Q:
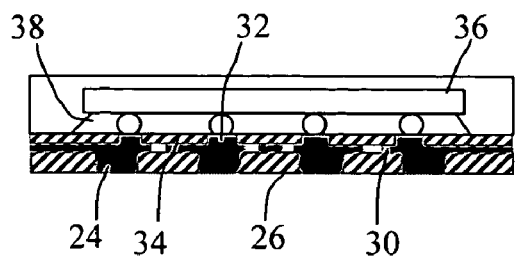

Singulation of the individual integrated circuit package 40 from the array is then performed either by saw singulation or by die punching, resulting in the package shown in FIG. 1Q.

Specific embodiments of the present invention have been shown and described herein. However, modifications and variations to these embodiments are possible. For example, other suitable metals can be used in any of the plating or printing steps described herein. Also, the present invention is not limited to the number of metal layers described herein. The process steps described with reference to FIGS. 1G to 1I can be repeated if multiple layers of circuitry are desired. Solder balls can be attached to the exposed surface of each of the contact pads 24. Also, the size and shape of many of the features can vary while still performing the same function.

Still other modifications and variations may occur to those skilled in the art. All such modifications and variations are believed to be within the sphere and scope of the present invention.

The invention claimed is:

1. A process for fabricating a pad frame for an integrated circuit package, the process comprising:
    building up metal on selective portions of a first side of a substrate to define a plurality of contact pads disposed in a first layer of dielectric material;
    depositing a metal seed layer on an exposed side of said contact pads and said dielectric material;
    applying a second metal layer on said metal seed layer;
    selectively etching said second metal layer and said metal seed layer to provide pad frame circuitry;
    building up metal on selective portions of said pad frame circuitry to define a plurality of die connect pads separated by a second layer of dielectric material, said die connect pads being electrically connected to said contact pads by said pad frame circuitry.

2. The process according to claim 1, wherein building up metal on selective portions of said first side of said substrate comprises:
    selectively plating said metal on said first side of said substrate.

3. The process according to claim 1, wherein building up metal on selective portions of said first side of said substrate comprises:
    applying a photo-imageable dielectric material on a first side of said substrate;
    exposing and developing said photo-imageable dielectric material to provide pits in said photo-imageable material in which said first side of said substrate is exposed;
    plating metal on said first side of said substrate, in said pits in said photo-imageable material.

4. The process according to claim 1, wherein plating metal on said first side of said substrate, in said pits comprises plating a plurality of metal layers in said pits to define said plurality of contact pads.

5. The process according to claim 1, wherein depositing said metal seed layer on said exposed side of said contact pads and said dielectric material comprises electroless plating said metal seed layer.

6. The process according to claim 1, wherein depositing said metal seed layer comprises sputter coating said exposed side of said contact pads and said dielectric material.

7. The process according to claim 1, wherein applying said second metal layer on said metal seed layer comprises electrolytic plating.

8. The process according to claim 1, wherein selectively etching said second metal layer and said metal seed layer to provide pad frame circuitry comprises:
    applying a photo-imageable etching mask to an exposed surface of said second metal layer;
    exposing and developing said etching mask to provide pits in said etching mask in which said second metal layer is exposed; and
    etching said second metal layer and said metal seed layer.

9. The process according to claim 1, wherein building up metal on selective portions of said pad frame circuitry comprises providing a plating mask on said pad frame circuitry followed by plating said die connect pads.

10. The process according to claim 1, wherein building up metal on selective portions of said pad frame circuitry comprises providing a mask on said pad frame, solder paste printing said metal, reflowing and coining said die connect pads.

11. A process for fabricating an integrated circuit package comprising:
    building up metal on selective portions of a first side of a substrate to define a plurality of contact pads disposed in a first layer of dielectric material;
    depositing a metal seed layer on an exposed side of said contact pads and said dielectric material;
    applying a second metal layer on said metal seed layer;
    selectively etching said second metal layer and said metal seed layer to provide pad frame circuitry;
    building up metal on selective portions of said pad frame circuitry to define a plurality of die connect pads separated by a second layer of dielectric material, said die connect pads being electrically connected to said contact pads by said pad frame circuitry;
    flip-chip mounting a semiconductor die to said die connect pads such that pads of said semiconductor die are electrically connected to said die connect pads by a plurality of solder bump connectors;
    providing an underfill material surrounding said solder ball connectors;
    etching away said substrate to expose said contact pads; and
    singulating said integrated circuit package.

12. The process according to claim 11, further comprising molding in a molding material to encapsulate said semiconductor die, prior to etching away said substrate.

13. The process according to claim 11, wherein building up metal on selective portions of said first side of said substrate comprises:
    selectively plating said metal on said first side of said substrate.

14. The process according to claim 11, wherein building up metal on selective portions of said first side of said substrate comprises:
    applying a photo-imageable dielectric material on a first side of said substrate;
    exposing and developing said photo-imageable dielectric material to provide pits in said photo-imageable material in which said first side of said substrate is exposed;
    plating metal on said first side of said substrate, in said pits in said photo-imageable material.

15. The process according to claim 11, wherein plating metal on said first side of said substrate, in said pits comprises plating a plurality of metal layers in said pits to define said plurality of contact pads.

16. The process according to claim 11, wherein depositing said metal seed layer on said exposed side of said contact pads and said dielectric material comprises electroless plating said metal seed layer.

17. The process according to claim 11, wherein depositing said metal seed layer comprises sputter coating said exposed side of said contact pads and said dielectric material.

18. The process according to claim 11, wherein applying said second metal layer on said metal seed layer comprises electrolytic plating.

19. The process according to claim 11, wherein selectively etching said second metal layer and said metal seed layer to provide pad frame circuitry comprises:

applying a photo-imageable etching mask to an exposed surface of said second metal layer;

exposing and developing said etching mask to provide pits in said etching mask in which said second metal layer is exposed; and etching said second metal layer and said metal seed layer.

20. The process according to claim 11, wherein building up metal on selective portions of said pad frame circuitry comprises providing a plating mask on said pad frame circuitry followed by plating said die connect pads.

21. The process according to claim 11, wherein building up metal on selective portions of said pad frame circuitry comprises providing a mask on said pad frame, solder paste printing said metal, reflowing and coining said die connect pads.

* * * * *

UNITED STATES PATENT AND TRADEMARK OFFICE
CERTIFICATE OF CORRECTION

| | |
|---|---|
| PATENT NO. | : 7,232,755 B1 |
| APPLICATION NO. | : 11/194993 |
| DATED | : June 19, 2007 |
| INVENTOR(S) | : Neil McLellan et al. |

It is certified that error appears in the above-identified patent and that said Letters Patent is hereby corrected as shown below:

At column 3, line 14, please delete the numeral "20".

At column 3, line 15, please change "FIGS. 1A to 1J" to --FIGS. 1A to 1L--.

At column 5, line 4, please delete the numeral "40".

Signed and Sealed this

Twenty-ninth Day of April, 2008

JON W. DUDAS
*Director of the United States Patent and Trademark Office*